(12) United States Patent
Nabeshima

(10) Patent No.: US 7,321,158 B2
(45) Date of Patent: Jan. 22, 2008

(54) METHOD OF MANUFACTURING VARIABLE CAPACITANCE DIODE AND VARIABLE CAPACITANCE DIODE

(75) Inventor: Yutaka Nabeshima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 106 days.

(21) Appl. No.: 11/011,037

(22) Filed: Dec. 15, 2004

(65) Prior Publication Data

US 2005/0148149 A1 Jul. 7, 2005

(30) Foreign Application Priority Data

Dec. 15, 2003 (JP) ............... P2003-416209
Apr. 5, 2004 (JP) ............... P2004-110683

(51) Int. Cl.
*H01L 29/00* (2006.01)
(52) U.S. Cl. ...................... 257/499
(58) Field of Classification Search ............ 257/499
See application file for complete search history.

(56) References Cited

U.S. PATENT DOCUMENTS 4,507,159 A 3/1985 Erh
6,339,249 B1 * 1/2002 Keller ............ 257/480

FOREIGN PATENT DOCUMENTS

| JP | 56-78174 | 6/1981 |
| JP | 11-68124 | 3/1999 |
| JP | 2003-158199 | 5/2003 |

OTHER PUBLICATIONS

Chinese Office Action Issued in Corresponding Chinese Patent Application No.200410101110.3, Dated on May 25, 2007.

* cited by examiner

*Primary Examiner*—Roy Potter
(74) *Attorney, Agent, or Firm*—McDermott Will & Emery LLP

(57) ABSTRACT

In a method of manufacturing a variable capacitance diode according to the present invention, a mask is formed on a semiconductor substrate of a first conductive type having a low impurity concentration, a semiconductor region of the first conductive type having an intermediate impurity concentration is formed on the semiconductor substrate by means of ion implantation via an opening portion of the mask, a semiconductor region of a second conductive type having a high impurity concentration is formed in the semiconductor substrate on a surface side thereof relative to the semiconductor region of the first conductive type having the intermediate impurity concentration via the same opening portion of the mask, and the semiconductor region of the first conductive type having the intermediate impurity concentration and the semiconductor region of the second conductive type having the high impurity concentration are activated by applying a heat treatment to the semiconductor substrate. In a variable capacitance diode according to the present invention, a structure in which an annular contact layer of a first conductive type is formed in a periphery of a semiconductor region of a second conductive type having a high impurity concentration constitutes each of a plurality of units and the plurality of units is disposed in an array.

6 Claims, 10 Drawing Sheets

F I G. 2
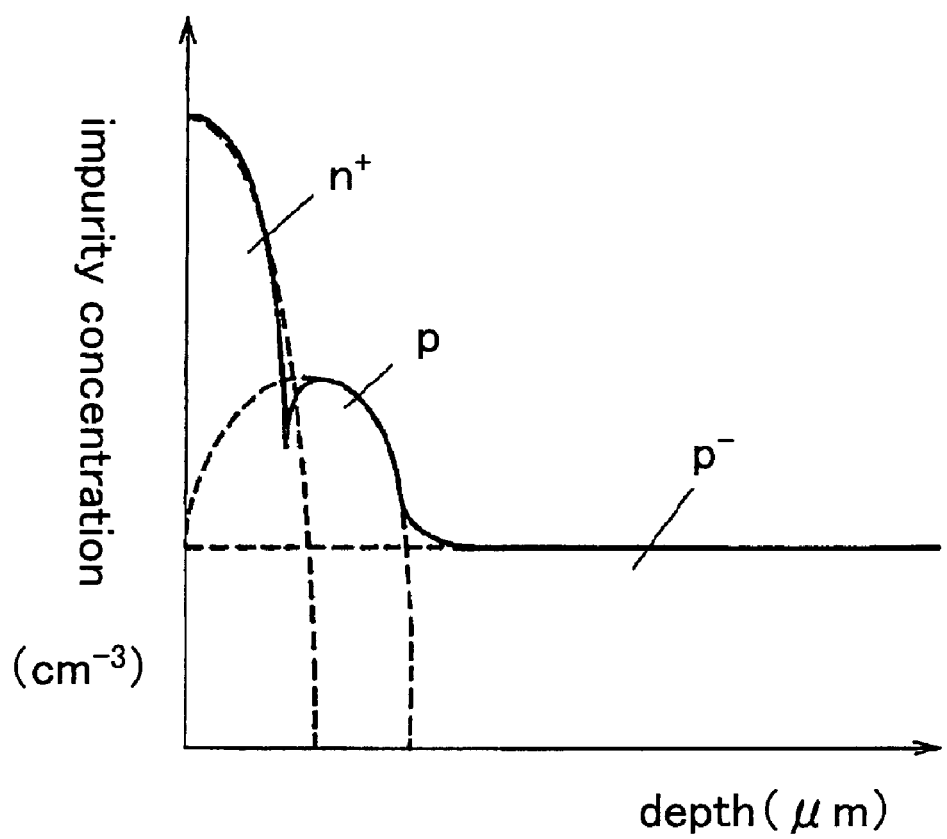

METHOD OF MANUFACTURING VARIABLE CAPACITANCE DIODE AND VARIABLE CAPACITANCE DIODE

BACKGROUND OF THE INVENTION

1. Field of the Invention

The present invention relates to a method of manufacturing a variable capacitance diode and the variable capacitance diode, more particularly to the variable capacitance diode, which is provided with MOS (metal oxide semiconductor) or a bipolar transistor and made into an integrated circuit.

2. Description of the Related Art

Along with the downsizing of mobile communication devices such as a portable telephone, one-chip technology has been promoted for circuits including external parts, such as a frequency synthesizer (PLL) and a voltage control oscillator. A variable capacitance diode constituting the VCO on a semiconductor substrate serves to control a capacitance value through the application of a reverse bias voltage utilizing a depletion-layer capacitance of pn-junction. It is necessary to integrate the variable capacitance diode so as to have a large capacitance variation ratio relative to a variation of the given voltage.

Referring to reference numerals in FIG. 10 illustrating an example of a conventional variable capacitance diode, 41 denotes an n type semiconductor substrate, 42 denotes an n⁻ region, 43 denotes an n region, 44 denotes an n' region, 45 denotes a cathode layer, 46 denotes a pn-junction, 47 denotes an anode layer (p⁺ region) and 48 denotes an inter-layer insulation film. The reverse bias voltage is applied to the pn-junction 46 so as to constitute the variation capacitance diode by means of a depletion layer mainly spreading in the cathode layer 45. FIG. 11 is a graph showing a distribution of an impurity concentration in section taken along D-D line of FIG. 10.

As a structure-wise demand to keep up with the miniaturization of a circuit element, the anode layer 47 is necessarily formed in a size larger than the cathode layer 45. In the case of the variable capacitance diode having the large capacitance variation ratio, a concentration gradient in the n' region of the pn junction portion is steep. Therefore, a concentration variation in connection with a fluctuation in the manufacturing process tends to be large. As a result, the variable capacitance ratio results in a significant fluctuation.

A key factor in obtaining the large capacitance variation ratio is to optimize a surface impurity concentration in a region where the pn-junction is formed and an impurity concentration profile and the like.

Referring to reference numerals in FIG. 12 illustrating another example of the conventional variable capacitance diode, 51 denotes an n type semiconductor substrate, 52 denotes a p⁻ region, 53 denotes a p region, 54 denotes an anode layer, 55 denotes a pn junction, 56 denotes a cathode layer (n⁺ region), 57 denotes an inter-layer insulation film, 58 denotes an anode contact layer, 59 denotes an anode electrode and 60 denotes a cathode electrode. The reverse bias voltage is applied to the pn-junction 55 so as to constitute the variation capacitance diode using a depletion layer mainly spreading in the anode layer 54. FIG. 13 is a graph showing a distribution of an impurity concentration in section taken along E-E line of FIG. 12. The miniaturization of the circuit element leads to the generation of a misalignment between the anode layer 54 (p region) and the cathode layer 56, which makes it difficult to improve a precision. Because a concentration gradient in the p region of the pn-junction portion is steep, the variable capacitance ratio results in a significant fluctuation.

Referring to reference numerals in FIG. 14 illustrating still another example of the conventional variable capacitance diode, 61 denotes a p type semiconductor substrate, 62 denotes an anode layer (p⁻ type layer), 63 denotes a cathode layer (n⁺ type layer), 64 denotes an anode contact layer (p⁺ type layer) and 65 denotes a separation insulation film. Because the separation insulation film 65 is present between the n⁺ type layer, which is the cathode layer 63 and the p⁺ type layer, which is the anode contact layer 64, a capacitance component in the horizontal direction cannot be effectively utilized when the reverse bias voltage is applied. As a result, an integrated absolute capacitance value of the variable capacitance diode results in a low capacitance particularly in a low voltage range, thereby failing to obtain a sufficient capacitance variation ratio. On the contrary, it is necessary to increase an area of the variable capacitance diode in an effort to obtain a desired absolute capacitance, which makes it difficult to miniaturize the circuit element.

BRIEF SUMMARY OF THE INVENTION

Therefore, a main object of the present invention is to reduce additional steps for the formation of a variable capacitance diode and provide a method of manufacturing the variable capacitance diode undergoing a reduced fluctuation and achieving a high precision. Referring to conductive types of a semiconductor hereinafter described, a first conductive type and a second conductive type respectively refer to one of p and n types of the semiconductor. When the first conductive type is the p type, the second conductive type is the n type. On the contrary, when the first conductive type is the n type, the second conductive type is the p type.

A method of manufacturing the variable capacitance diode according to the present invention comprises:

a step of forming a mask so as to open a region where the variable capacitance diode is formed on a semiconductor substrate of the first conductive type having a low impurity concentration;

a step of forming a semiconductor region of the first conductive type having an intermediate impurity concentration on the semiconductor substrate by means of ion implantation via the opening portion of the mask;

a step of forming a semiconductor region of the second conductive type having a high impurity concentration in the semiconductor substrate on a surface side thereof relative to the semiconductor region of the first conductive type having the intermediate impurity concentration via the opening portion of the mask; and a step of activating the semiconductor region of the first conductive type having the intermediate impurity concentration and the semiconductor region of the second conductive type having the high impurity concentration by applying a heat treatment to the semiconductor substrate.

As a first advantage in the foregoing manufacturing method, the anode layer and the cathode layer of the variable capacitance diode are formed by means of the identical mask so as to form the anode and cathode layers in a self-aligning manner. As a result, the anode and cathode layers do not undergo any misalignment, which prevents the reduction of a precision due to the miniaturization of the circuit element. As another advantage, steps to be added for the formation of the variable capacitance diode in an LSI process can be reduced because only one mask-related step is implemented.

Another method of manufacturing the variable capacitance diode according to the present invention comprises:

a step of forming a semiconductor region of the first conductive type having the low impurity concentration in a semiconductor substrate of the second conductive type having the low impurity concentration;

a step of forming the mask so as to open the region where the variable capacitance diode is formed on the semiconductor substrate of the first conductive type having the low impurity concentration;

a step of forming the semiconductor region of the first conductive type having the intermediate impurity concentration in the semiconductor region of the first conductive type having the low impurity concentration by means of the ion implantation via the opening portion of the mask;

a step of forming the semiconductor region of the second conductive type having the high impurity concentration in the semiconductor substrate on a surface side thereof relative to the semiconductor region of the first conductive type having the intermediate impurity concentration formed in the semiconductor region of the first conductive type having the low impurity concentration via the opening portion of the mask; and a step of activating the semiconductor region of the first conductive type having the intermediate impurity concentration and the semiconductor region of the second conductive type having the high impurity concentration by applying the heat treatment to the semiconductor substrate.

A technical feature in the foregoing constitution is that the semiconductor region of the first conductive type having the intermediate impurity concentration and the semiconductor region of the second conductive type having the high purity concentration are formed, not on the semiconductor substrate itself, but in another semiconductor region formed in the semiconductor substrate. More specifically, the semiconductor region of the first conductive type having the low impurity concentration is formed in the semiconductor substrate of the second conductive type having the low impurity concentration, and the anode and cathode layers are formed in the semiconductor region of the first conductive type having the low impurity concentration.

In the foregoing method, in addition to the operation effect described earlier, anode and cathode potentials can be optionally set without any restriction from a potential of the semiconductor substrate because the anode and cathode layers are in an electrically floating state with respect to the semiconductor substrate.

In either of the two methods of manufacturing the variable capacitance diode, of the step of forming the semiconductor region of the first conductive type having the intermediate impurity concentration and the step of forming the semiconductor region of the second conductive type having the high impurity concentration, the formation of the semiconductor region of the first conductive type having the intermediate impurity concentration may precede the formation of the semiconductor region of the second conductive type having the high impurity concentration, or the semiconductor region of the second conductive type having the high impurity concentration may be formed first, thereafter followed by the formation of the semiconductor region of the first conductive type having the intermediate impurity concentration.

In the case of a process of a CMOS transistor-installed LSI, the step of forming the semiconductor region of the first conductive type having the intermediate impurity concentration and the step of forming the semiconductor region of the second conductive type having the high impurity concentration may be implemented at the same time as the formation of source and drain regions in the CMOS transistor. When those regions are formed at the same time as the formation of the source and drain regions, it becomes unnecessary to add any mask-related step. The variable capacitance diode can be formed with only an additional step, which is the ion implantation step for the anode and cathode layers.

Further, referring to the step of forming the semiconductor region of the first conductive type having the low impurity concentration, the foregoing semiconductor region may be formed at the same time as the formation of a well region in the CMOS transistor.

Further, the formation of the semiconductor region of the first conductive type having the intermediate impurity concentration by means of the ion implantation is preferably implemented so that a position of a peak concentration of the foregoing semiconductor region after the heat treatment falls on a position of the pn-junction between the foregoing semiconductor region and the semiconductor region of the second conductive type having the high impurity concentration. Thereby, a concentration gradient of the semiconductor region of the first conductive type having the intermediate impurity concentration in the pn-junction portion becomes moderate reducing a concentration variation in the pn-junction portion caused by a manufacturing fluctuation. As a result, a variable capacitance ratio can be prevented from fluctuating.

Further, according to the present invention, the high-performance variable capacitance diode having a capacitance variation ratio sufficiently large relative to a desired absolute capacitance and capable of controlling an area increase thereof can be provided by effectively utilizing a capacitance component of the variable capacitance diode in the horizontal direction and defining the respective diffusion layers constituting the variable capacitance diode.

In the variable capacitance according to the present invention, as described, units each having a structure, where the contact layer of the first conductive type having an annular shape is formed in a periphery the semiconductor region of the second conductive type having the high impurity concentration, are disposed in an array.

Further, an interval between the semiconductor region of the second conductive type having the high impurity concentration and the contact layer of the first conductive type is equal to or more than a width of a depletion layer formed at a minimum voltage of a used reverse bias voltage and equal to or less than a width of a depletion layer formed at a maximum voltage thereof.

The capacitance component of the variable capacitance diode is resolved into a component in the horizontal direction and a component in the vertical direction. In the case of the horizontal component, the width of the depletion layer when the reverse bias voltage is applied is subjected to a restriction from the interval between the semiconductor region of the second conductive type having the high impurity concentration and the annular contact layer of the first conductive type. Therefore, when the circuit element is miniaturized, the horizontal component results in a relatively high absolute capacitance value. The vertical component, on the contrary, is free from any restriction from the width of the depletion layer when the reverse bias voltage is applied compared to the horizontal component, therefore resulting in a relatively low absolute capacitance value.

In the case of the horizontal component being in an excessive proportion, the capacitance variation ratio deteriorates because the absolute capacitance value is increased in a high voltage range. In the case of the horizontal component being in too a small proportion, the capacitance variation ratio deteriorates because the absolute capacitance value is decreased in a low voltage range. There are an area ratio of the semiconductor region of the second conductive type having the high impurity concentration (ratio of side area/bottom area) and interval between the semiconductor region of the second conductive type having the high impurity concentration and the annular contact layer of the first conductive type, at which the capacitance variation ratio reaches its maximum. Because of that, units each constituted in such manner as to sufficiently increase the capacitance variation ratio are disposed in the array. Thereby, the variable capacitance diode achieving the capacitance variation ratio that is sufficiently large relative to the desired absolute capacitance value can be obtained. As a result, the variable capacitance diode having a desired characteristic can be provided without modifying the diffusion layers and formation steps.

Additional objects and advantages of the invention will be apparent from the following description of preferred embodiments of the invention, which are best understood with reference to the accompanying drawings.

BRIEF DESCRIPTION OF THE DRAWINGS

FIG. 2 is a graph showing a distribution of an impurity concentration in section taken along A-A line of FIG. 1F.

DETAILED DESCRIPTION OF THE PREFERRED EMBODIMENTS

Embodiment 1

Figure 1:
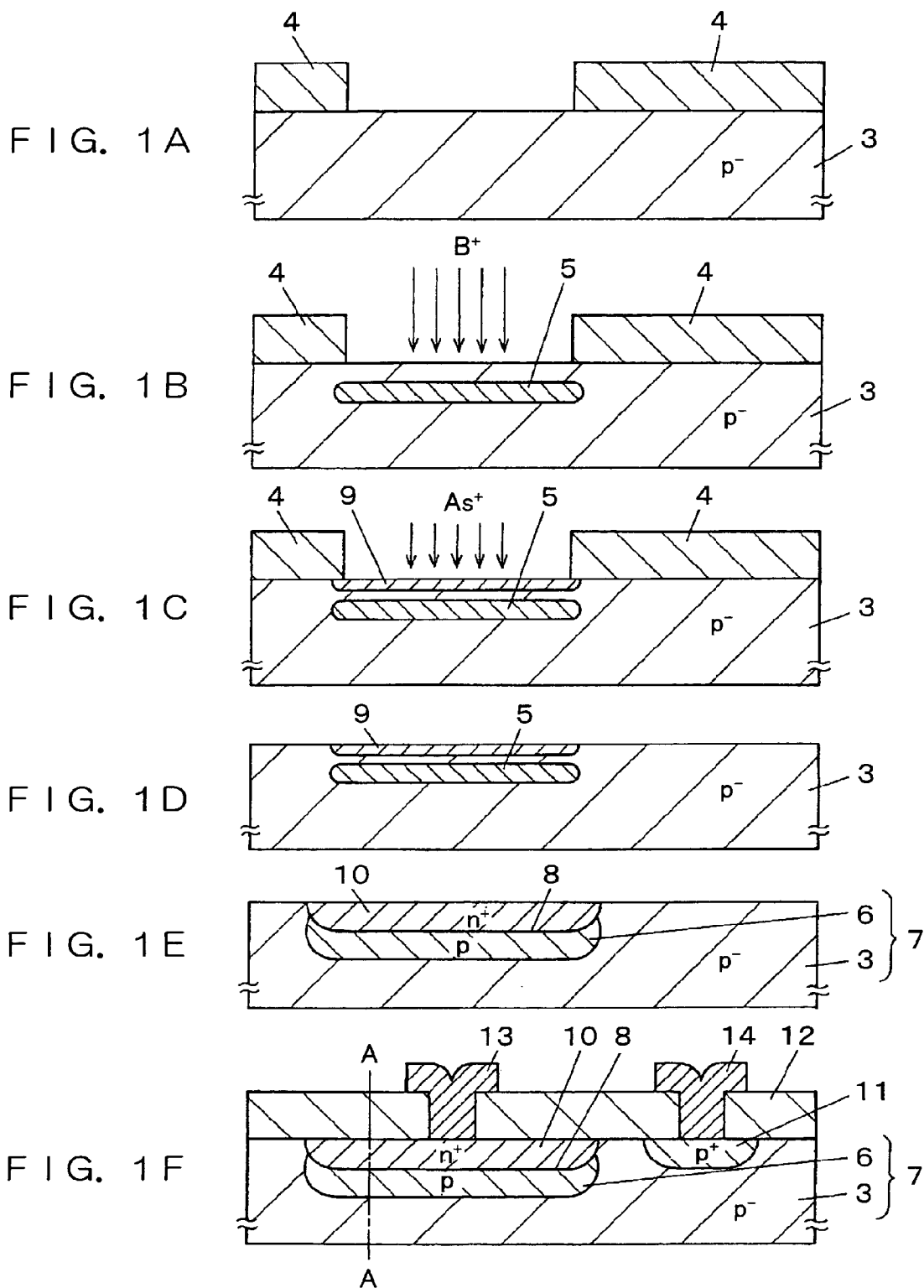
FIGS. 1A-1F are sectional views of main steps illustrating a method of manufacturing a variable capacitance diode according to an embodiment 1 of the present invention.

Hereinafter, a method of manufacturing a variable capacitance diode according to an embodiment 1 of the present invention is described referring to the drawings.

Referring to reference numerals in FIGS. 1A-1F, 3 denotes a p$^-$ type semiconductor substrate, 4 denotes a mask material, 5 denotes a B$^+$ ion implementation layer, 6 denotes a p region, 7 denotes an anode layer, 8 denotes a pn-junction, 9 denotes an As$^+$ ion implantation layer, 10 denotes a cathode layer (n+region), 11 denotes an anode contact layer, 12 denotes an inter-layer insulation film, 13 denotes a cathode electrode and 14 denotes an anode electrode.

The method of manufacturing a variable capacitance diode according to the embodiment 1 having the foregoing structure is described below.

First, as shown in FIG. 1A, the mask material 4 is formed on the semiconductor substrate 3 so as to open a region where the variable capacitance diode is formed.

Next, as shown in FIG. 1B, B$^+$ ions are implanted in the opening portion of the mask material 4 so as to form the B$^+$ ion implantation layer 5 in the substrate 3. The B$^+$ ion implantation layer 5 is formed so that a peak concentration in the p region 6, which will be described later, finally falls on a position of the pn junction 8 between the p region 6 and the cathode layer 10.

Next, as shown in FIG. 1C, As$^+$ ions are implanted in the opening portion of the mask material 4 as in the earlier description so as to form the As$^+$ ion implantation layer 9 on the B$^+$ ion implantation layer 5 in the substrate 3. The As$^+$ ion implantation layer 9 is formed so that a peak concentration in the cathode layer 10, which will be described later, falls on a vicinity of a surface of the substrate 3.

Next, as shown in FIG. 1D, the mask material 4 is removed so as to obtains the B$^+$ ion implantation layer 5 and the As$^+$ ion implantation layer 9 in the substrate 3.

Next, as shown in FIG. 1E, the B$^+$ ion implantation layer 5 and the As$^+$ ion implantation layer 9 are activated by means of a heat treatment so as to form the respective layers into the anode layer 7 and the cathode layer (n$^+$ region) 10.

Finally, as shown in FIG. 1F, the anode contact layer 11, inter-layer insulation film 12, cathode electrode 13 and anode electrode 14 are sequentially formed. Thus, a semiconductor device in which the variable capacitance diode is formed can be obtained.

The present embodiment has the following advantages.

First, the anode layer and the cathode layer are formed using the same mask by means of the ion implantation method, which enables the formation of the anode layer and the cathode layer in a self-aligning manner.

Further, in the case of a process of LSI in which a CMOS transistor is installed, the cathode layer of the variable capacitance diode and source and drain regions of an nMOS transistor can be concurrently formed, and the anode contact layer of the variable capacitance diode and source and drain regions of a pMOS transistor can be also concurrently formed. Then, it becomes unnecessary to add a mask-related step. The variable capacitance diode can be formed with only an additional a step, in which the ion implantation is implemented for the p region of the anode layer.

Next, as shown in FIG. 2, the B$^+$ ion implantation layer is formed so that the peak concentration in the p region finally falls on the pn-junction portion between the p region and the n$^+$ region. In such a manner, a concentration gradient of the p region in the pn-junction portion becomes moderate. Therefore, a concentration variation in the pn-junction portion due to a manufacturing fluctuation can be reduced, as a result of which a fluctuation of a variable capacitance ratio can be controlled.

In the process described above, the concentration in the substrate 3 is preferably at most $1\times10^{17}$ cm$^{-3}$, the peak concentration in the p region 6 is preferably at least $5\times10^{16}$ cm$^{-3}$ and at most $1\times10^{18}$ cm$^{-3}$, and the peak concentration in the cathode layer (n$^+$ region) 10 is preferably at least $1\times10^{20}$ cm$^{-3}$.

Embodiment 2

Next, a method of manufacturing a variable capacitance diode according to an embodiment 2 of the present invention is described referring to the drawings.

Referring to reference numerals in FIGS. 3A-3F, 1 denotes an n type semiconductor substrate and 2 denotes a p$^-$ region. The rest of the constitution is the same as in the embodiment 1, and any identical part between the two embodiments is provided with the same reference numeral.

The n type semiconductor substrate 1 is used in place of the p$^-$ type semiconductor substrate 3 in the embodiment 1. The p$^-$ region 2 is formed on the semiconductor substrate 1 so that a base on which the variable capacitance diode is formed is arranged to be the same as that of the embodiment 1.

The method of manufacturing a variable capacitance diode according to the embodiment 2 having the foregoing structure is described.

Figure 3A:
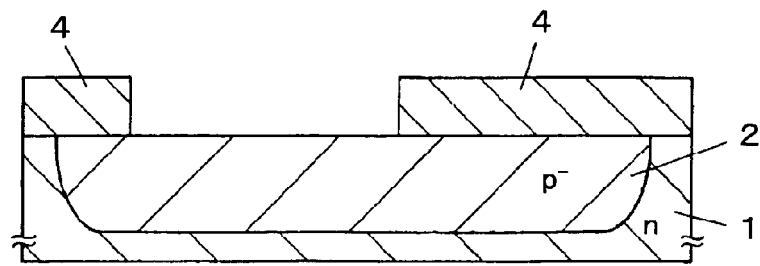
FIGS. 3A-3F are sectional views of main steps illustrating a method of manufacturing a variable capacitance diode according to an embodiment 2 of the present invention.

First, as shown in FIG. 3A, the p$^-$ region 2 is formed on the semiconductor substrate 1, and then, the mask material 4 is formed so as to open the region where the variable capacitance diode is formed.

Figure 3B:
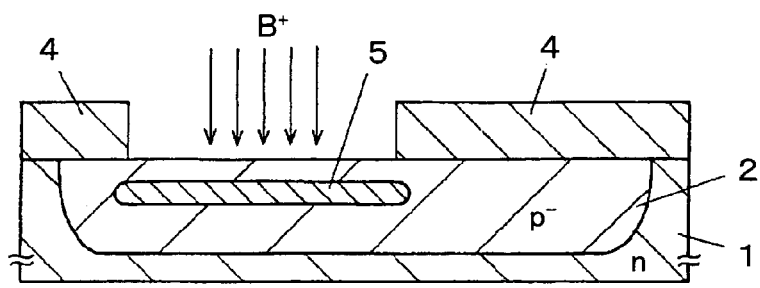

Next, as shown in FIG. 3B, the B$^+$ ions are implanted in the opening portion of the mask material 4 so as to form the B$^+$ ion implantation layer 5 in the p$^-$ region 2. The B$^+$ ion implantation layer 5 is formed so that the peak concentration in the p region 6, which will be described later, finally falls on the position of the pn junction 8 between the p region 6 and the cathode layer 10.

Figure 3C:
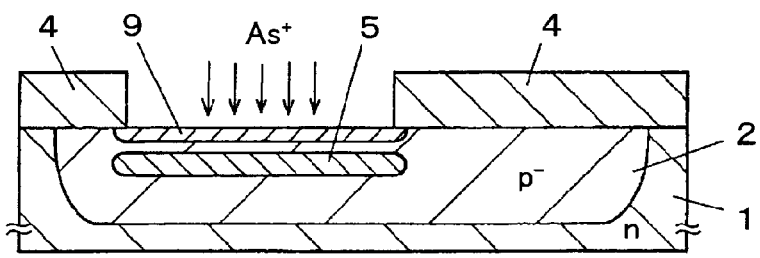

Next, as shown in FIG. 3C, the As$^+$ ions are implanted in the opening portion of the mask material 4 as in the earlier description so as to form the As$^+$ ion implantation layer 9 on the B$^+$ ion implantation layer 5 in the p$^-$ region 2. The As$^+$ ion implantation layer 9 is formed so that the peak concentration in the cathode layer 10, which will be described later, falls on a vicinity of a surface of the p$^-$ region 2.

Figure 3D:
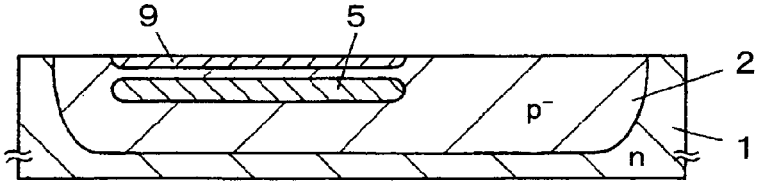

Next, as shown in FIG. 3D, the mask material 4 is removed so as to obtains the B$^+$ ion implantation layer 5 and the As$^+$ ion implantation layer 9 in the p$^-$ region 2.

Figure 3E:
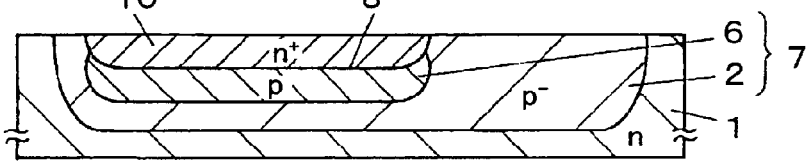

Next, as shown in FIG. 3E, the B$^+$ ion implantation layer 5 and the As$^+$ ion implantation layer 9 are activated by means of the heat treatment to thereby form the respective layers into the anode layer 7 and the cathode layer (n$^+$ region) 10.

Figure 3F:
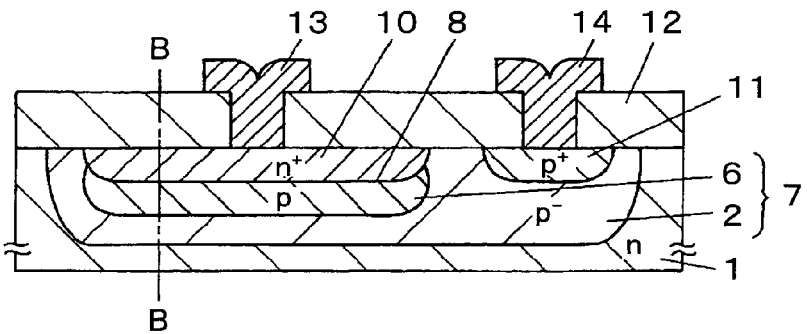

Finally, as shown in FIG. 3F, the anode contact layer 11, inter-layer insulation film 12, cathode electrode 13 and anode electrode 14 are sequentially formed. Thus, the semiconductor device in which the variable capacitance diode is formed can be obtained.

The present embodiment offers the following advantages in addition to the advantages described in the embodiment 1.

First, the p$^-$ region is formed on the n type semiconductor substrate, and the variable capacitance diode is thereafter formed in the p$^-$ region. In that manner, the anode and cathode layers are in an electrically floating state with respect to the substrate. More specifically, while the structure according to the embodiment 1 is subjected to the restriction that the anode electrode always has a potential identical to that of the substrate, according to the embodiment 2, the anode and cathode potentials can be set to an optional potential when the anode and cathode layers are used because those layers are in the electrically floating state with respect to the substrate potential.

Further, in the case of the process of the CMOS transistor-installed LSI, the p$^-$ region in the anode layer of the variable capacitance diode and a p well region of the nMOS transistor can be concurrently formed, which enables the formation of the variable capacitance diode without adding further step.

Figure 4:
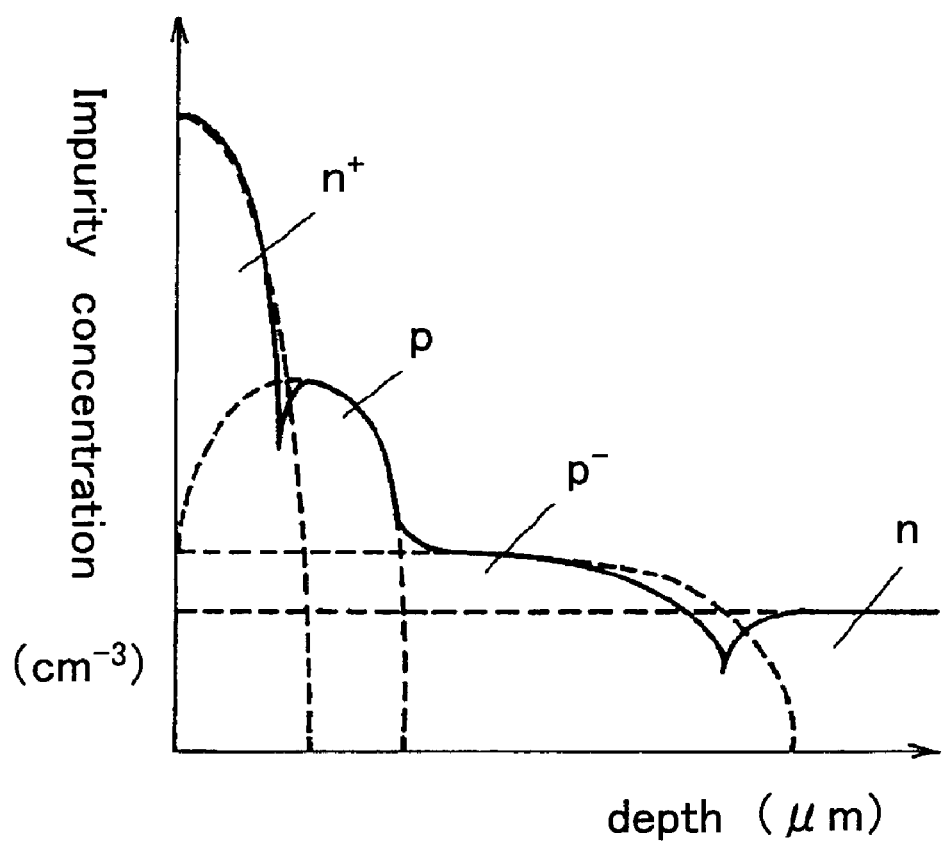
FIG. 4 is a graph showing a distribution of an impurity concentration in section taken along B-B line of FIG. 3F.

Next, as shown in FIG. 4, the B$^+$ ion implantation layer is formed so that the peak concentration in the p region finally falls on the pn-junction portion between the p region and the n$^+$ region. In such a manner, a concentration gradient of the p region in the pn-junction portion becomes moderate. Therefore, a concentration variation in the pn-junction portion due to a manufacturing fluctuation can be reduced, as a result of which a fluctuation of a variable capacitance ratio can be controlled.

In the foregoing example, a peak concentration in the p$^-$ region 2 is preferably at least $1\times10^{16}$ cm$^{-3}$ and at most $1\times10^{17}$ cm$^{-3}$, while the peak concentrations in the p region 6 and the cathode layer (n$^+$ region) 10 are the same as in the embodiment 1.

The following modification example is also effective in contrast to the embodiments 1 and 2.

The ion implantation method using the As$^+$ ions is employed in the method of forming the cathode layer 10, however, a vapor deposition diffusion method or the like can be also employed. The present invention does not provide any limitation for the method of forming the cathode layer 10.

Further, the B$^+$ ion implantation layer 5 and the As$^+$ ion implantation layer 9 can be formed in the reverse order meaning the As$^+$ ion implantation layer 9 is formed prior to the formation of the B$^+$ ion implantation layer 5, by which the same effect can be achieved.

There is no limitation to the ionic species in the B$^+$ ion implantation layer 5 and the As$^+$ ion implantation layer 9 as far as the respective conductive types are satisfied.

Further, the present embodiment was described providing that the first conductive type is the p type, and the second conductive type is the n type. However, the n type and the p type may be respectively used as the first conductive type and the second conductive type, by which the same effect can be obtained.

Further, there is no limitation to the presence or absence of a surface protection film when the ions are implanted and a type, thickness and the like of the mask material and the inter-layer insulation film.

Embodiment 3

Hereinafter, a method of manufacturing a variable capacitance diode according to an embodiment 3 of the present invention is described referring to the drawings.

Figure 5A:
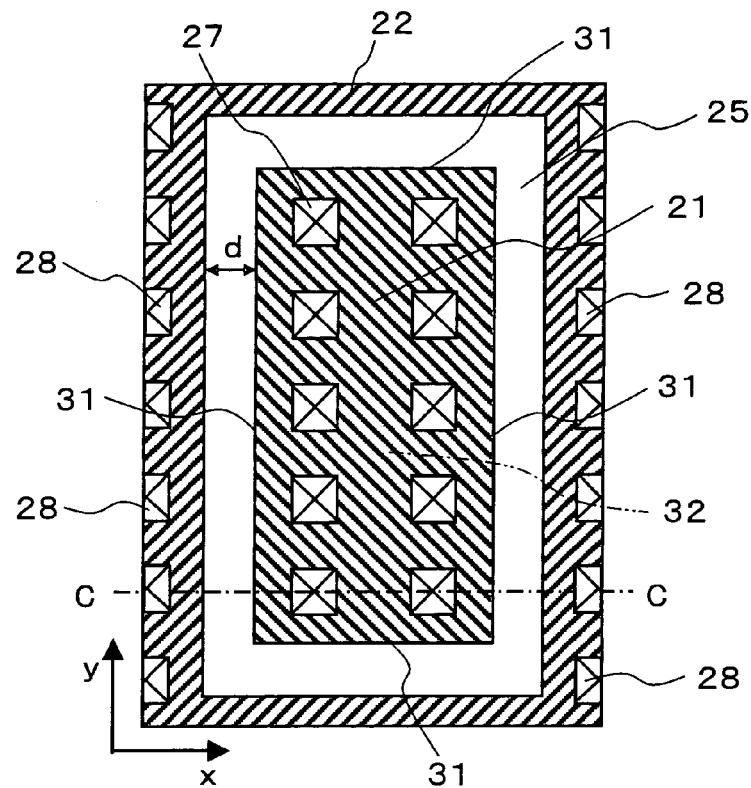
FIG. 5A is a plan view of a part of a single unit of a variable capacitance diode according to an embodiment 3 of the present invention.
Figure 5B:
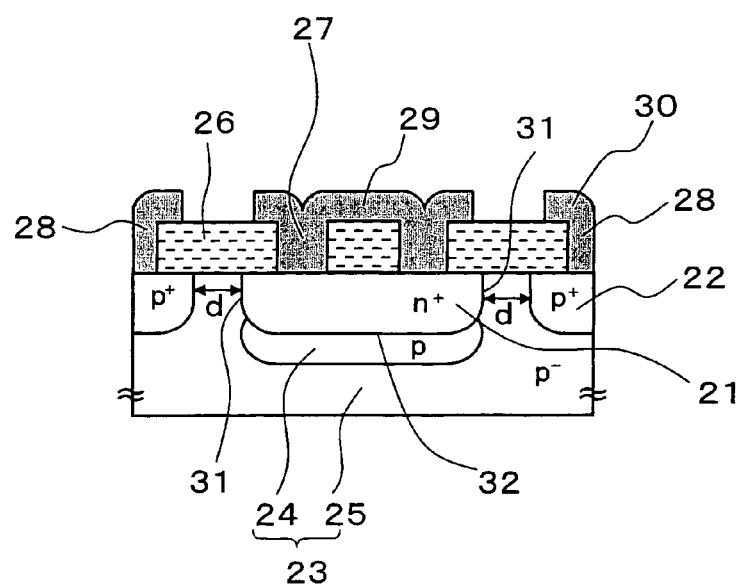
FIG. 5B is a sectional view taken along C-C line of FIG. 5A.
Figure 6:
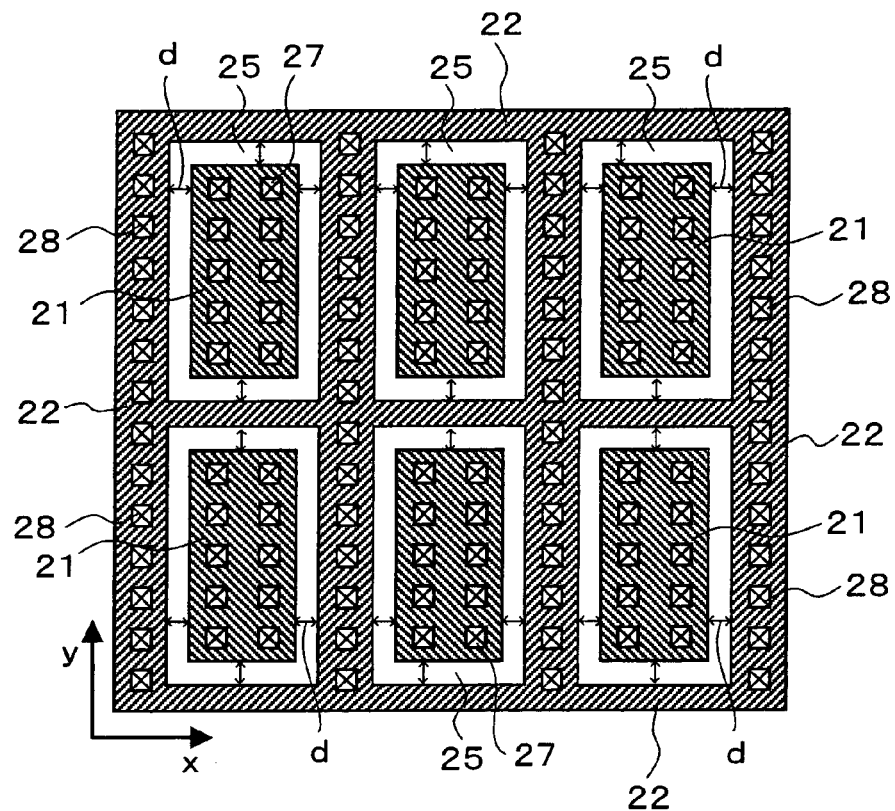
FIG. 6 is a plan view illustrating an entire structure of a variable capacitance diode according to the embodiment 3.

FIG. 5A is a plane view of a single unit in FIG. 6. FIG. 5B is a sectional view taken along C-C line of FIG. 5A.

Referring to reference numerals in FIGS. 5 and 6, 21 denotes a cathode layer comprised of a semiconductor region of the second conductive type having a high impurity concentration, 22 denotes an anode contact layer of the first conductive type having an annular shape, 23 denotes an anode layer (diffusion layer of the first conductive type), 24 denotes a p region, 25 denotes a p⁻ region, 26 denotes an inter-layer insulation film, 27 denotes a cathode contact, 28 denotes an anode contact, 29 denotes a cathode electrode, 30 denotes an anode electrode, 31 denotes a side surface part of the cathode layer (area S1), 32 denotes a bottom surface part of the cathode layer (area Sv), d denotes an interval between the cathode layer 21 and the annular anode contact layer 22.

An operation of the variable capacitance diode according to the present embodiment is described.

A capacitance component of the variable capacitance diode is resolved into a component in the horizontal direction and a component in the vertical direction.

First, The horizontal component, because a width of a depletion layer when a reverse bias voltage is applied is subjected to a restriction from the interval d between the cathode layer 21 and the annular anode contact layer 22, results in a relatively high absolute capacitance value. The vertical component, on the contrary, is free from any restriction from the width of the depletion layer when the reverse bias voltage is applied compared to the horizontal component, therefore resulting in a relatively low absolute capacitance value.

Figure 7:
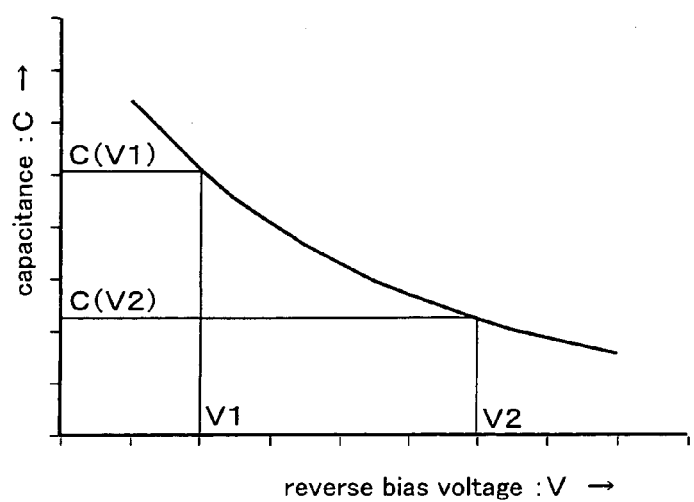
FIG. 7 is a correlation graph of a capacitance of the variable capacitance diode and a reverse bias voltage.
Figure 8:
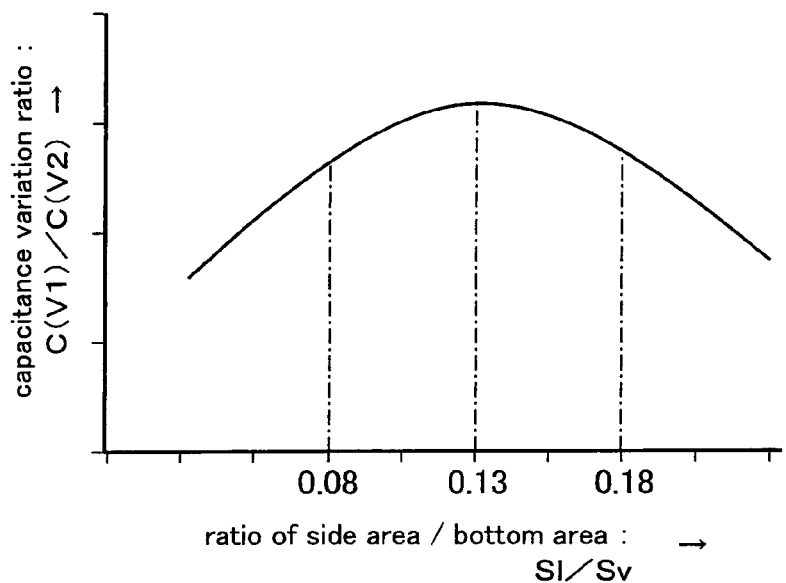
FIG. 8 is a correlation graph of a capacitance variation ratio of the variable capacitance diode and a ratio of side area/bottom area.
Figure 9:
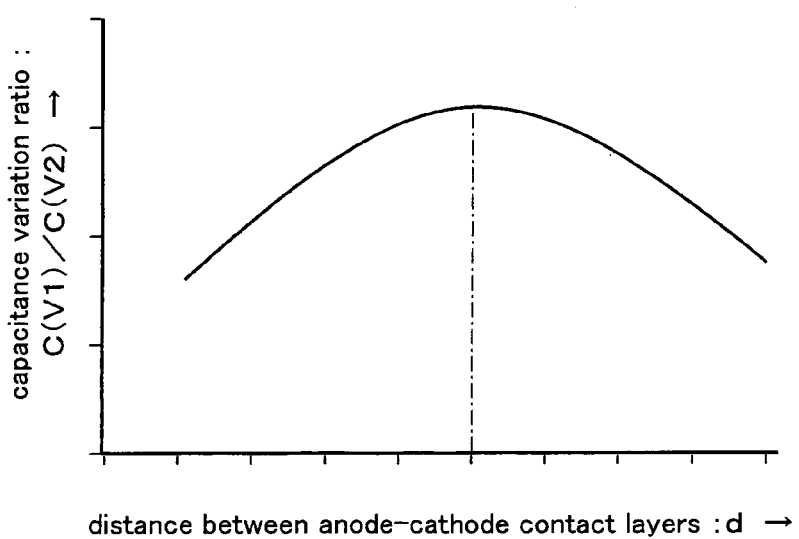
FIG. 9 is a correlation graph of the capacitance variation ratio of the variable capacitance diode and a distance between anode and cathode contact layers.
Figure 10:
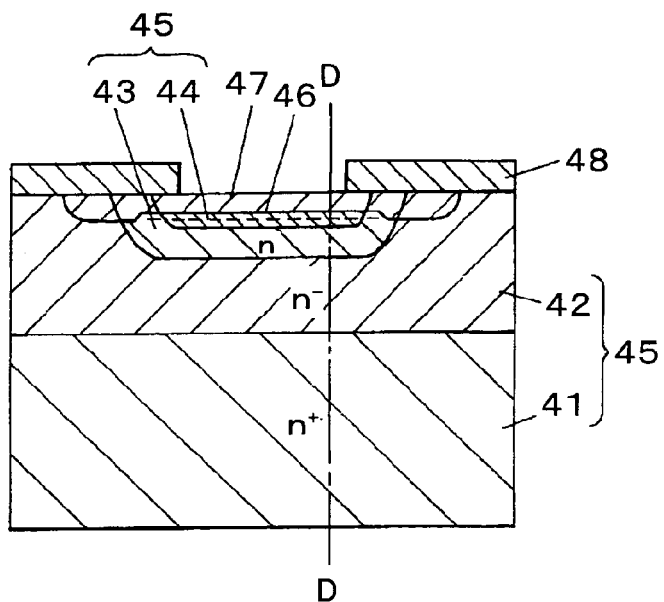
FIG. 10 is an illustration of a structure of a variable capacitance diode according to a first conventional example.
Figure 11:
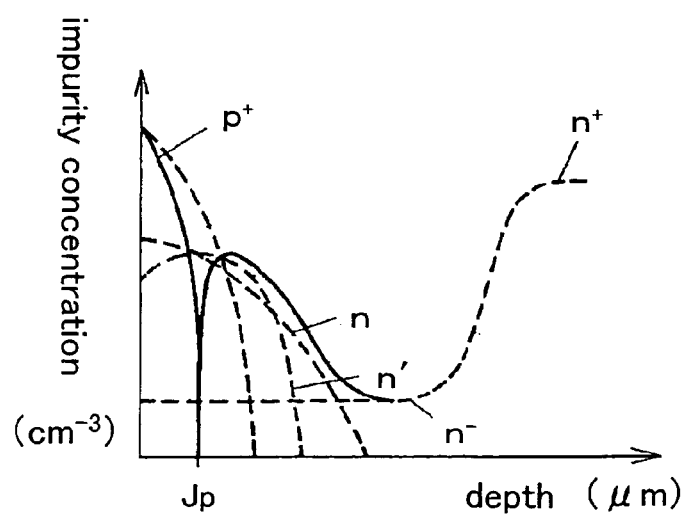
FIG. 11 is a graph showing a distribution of an impurity concentration in section taken along D-D line of FIG. 10.
Figure 12:
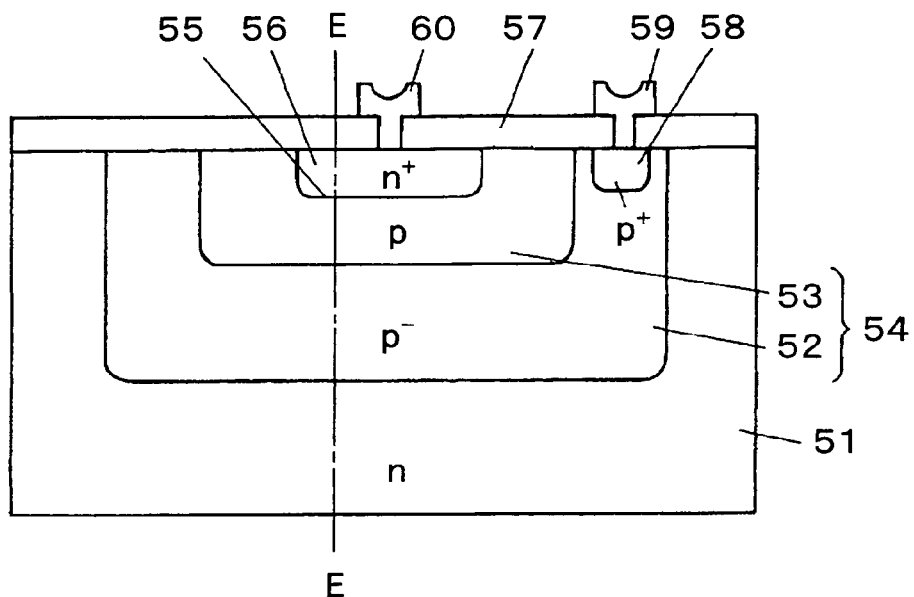
FIG. 12 is an illustration of a structure of a variable capacitance diode according to a second conventional example.
Figure 13:
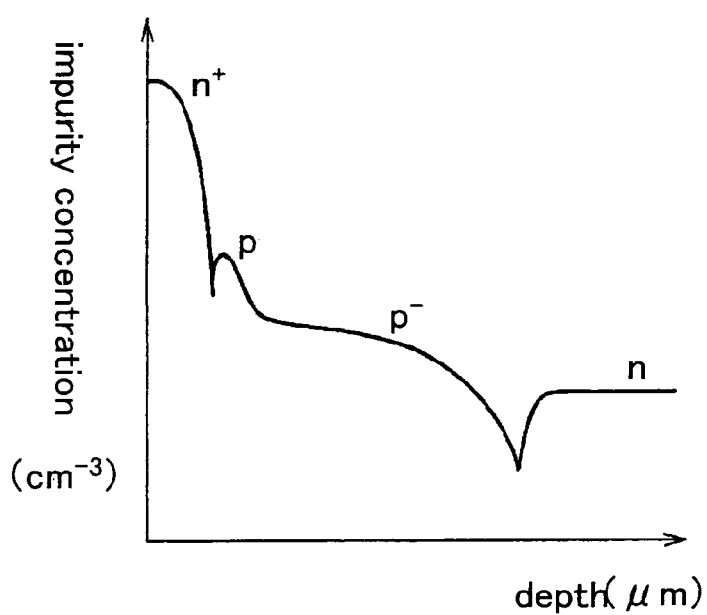
FIG. 13 is a graph showing a distribution of an impurity concentration in section taken along E-E line of FIG. 12.
Figure 14:
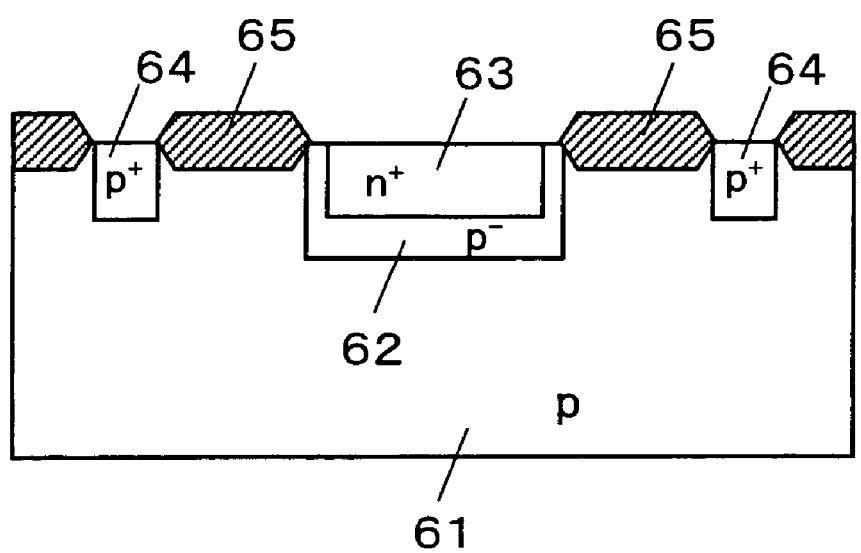
FIG. 14 is an illustration of a structure of a variable capacitance diode according to a third conventional example.

In the case of the horizontal component being in an excessive proportion, a capacitance variation ratio deteriorates because the absolute capacitance value is increased in a high voltage range V2 in FIG. 7. When the horizontal component is included in too a small proportion, the capacitance variation ratio deteriorates because the absolute capacitance value is decreased in a low voltage range V1. There are an area ratio of the cathode layer 21 (ratio of side area/bottom area: S1/Sv) (see FIG. 8) and interval d between the cathode layer 21 and the annular anode contact layer 22 (see FIG. 9), at which the capacitance variation ratio reaches its maximum. According to the present embodiment, units, in which the annular anode contact layer 22 is formed in a periphery the cathode layer 21, are disposed in an array. Thereby, the variable capacitance diode achieving a capacitance variation ratio that is sufficiently large relative to a desired absolute capacitance value can be obtained. As a result, the variable capacitance diode having the desired characteristic can be provided without modifying the diffusion layers and steps.

Next, the intervals between the cathode layers 21 and the annular anode contact layers 22 are set to be equal. Thereby, the variable capacitance diode achieving the capacitance variation ratio that is sufficiently large relative to the desired absolute capacitance value can be obtained. As a result, the variable capacitance diode controlling an area increase thereof and capable of exerting a high performance can be provided.

Next, a plurality of units where the intervals between the cathode layers 21 and the annular anode contact layers 22 are respectively different is formed so that, when the used voltage of the variable capacitance diode is provided in different ranges, the variable capacitance diode having the desired capacitance variation ratio relative to the desired absolute capacitance value can be obtained in the respective ranges of the used voltage. As a result, a plurality of variable capacitance diodes can be provided without adding another diffusion layer or step.

Further, the variable capacitance diode having a large capacitance variation ratio relative to the desired absolute capacitance value can be obtained when the area ratio of the cathode layer 21 is set in the range of side area/bottom area =0.08-0.18. As a result, the variable capacitance diode having the desired characteristic can be provided without adding another diffusion layer or step.

Further, the variable capacitance diode having the capacitance variation ratio that is sufficiently large relative to the desired absolute capacitance value can be obtained when the area ratio of the cathode layer 21 is set to side area/bottom area≈0.13 (0.13 is an intermediate value in the range of 0.08-0.18). As a result, the variable capacitance diode controlling the area increase thereof and capable of exerting a high performance can be provided.

Further, the capacitance component in the horizontal direction of the variable capacitance diode can be effectively utilized when the interval between the cathode layer 21 and the annular anode contact layer 22 is equal to or more than the width of the depletion layer formed at a minimum voltage of the used reverse bias voltage and equal to or less than the width of the depletion layer formed at a maximum voltage thereof. As a result, the variable capacitance diode controlling the area increase thereof and capable of exerting a high performance can be provided.

The present embodiment was described by means of a so-called super abrupt junction structure including the p region 24 and p⁻ region 25 constituting the anode layer 23. However, there is not limitation to the structure of the variable capacitance diode in a depth direction thereof as far as the variable capacitance diode utilizes the pn-junction.

Further, the present embodiment was described providing that the first conductive type is the p type, and the second conductive type is the n type. However, the p type and the n type may be respectively used as the first conductive type and the second conductive type, by which the same effect can be obtained.

Further, the anode contact layer 28 is formed only in a direction parallel with a y direction of the annular anode contact layer 22, however, may be formed in a direction parallel with a x direction thereof. There is no limitation to the location, shape and formation method of the anode contact layer 28. When the anode contact layer 28 is formed only in the direction parallel with the y direction as in the present embodiment, the cathode electrode 29 and the anode electrode 30 can be formed by means of a same wiring layer. As a result, it becomes advantageously unnecessary to add further step for a new wiring layer.

Further, the cathode contact 27 and the anode contact 28 are both formed in the array, however, are not subjected to any limitation in the location, shape and formation method of the contacts as far as they are respectively connected to the cathode layer 21 and the annular anode contact layer 22.

Further, the inter-layer insulation film 26, cathode contact 27, anode contact 28, cathode electrode 29 and anode electrode 30 were used for the convenience of describing the present embodiment. It is obvious that those elements are not subjected to any limitation in a film type, film thickness, location, shape, formation method, conditions in formation and the like.

What is claimed is:

1. A variable capacitance diode, comprising:
   a semiconductor substrate and a plurality of units disposed in an array on the semiconductor substrate, each of the units including:
   a first semiconductor region of a first conductive type having a low impurity concentration;
   a second semiconductor region of the first conductive type having an intermediate impurity concentration;
   a third semiconductor region of a second conductive type having a high impurity concentration; and an annular contact layer of the first conductive type in the periphery of the third semiconductor region, wherein a side surface of the third semiconductor region is connected to the first semiconductor region, and a bottom surface of the third semiconductor region is connected to the second semiconductor region.

2. A variable capacitance diode as claimed in claim 1, wherein the plurality of units is constituted in a manner that respective intervals between the semiconductor region of the second conductive type having the high impurity concentration and the contact layer of the first conductive type in a plane direction thereof are equal to one another.

3. A variable capacitance diode as claimed in claim 1, wherein the plurality of units is constituted in a manner that respective intervals between the semiconductor region of the second conductive type having the high impurity concentration and the contact layer of the first conductive type in a plane direction thereof are different to one another.

4. A variable capacitance diode as claimed in claim 1, wherein, in the semiconductor region of the second conductive type having the high impurity concentration, an area ratio of a side surface part relative to a bottom surface part thereof is set within a range of 0.08-0.18.

5. A variable capacitance diode as claimed in claim 1, wherein, in the semiconductor region of the second conductive type having the high impurity concentration, an area ratio of a side surface part relative to a bottom surface part thereof is substantially set to 0.13.

6. A variable capacitance diode as claimed in claim 1, wherein an interval between the semiconductor region of the second conductive type having the high impurity concentration and the contact layer of the first conductive type is equal to or more than a width of a depletion layer formed at a minimum voltage of a used reverse bias voltage and equal to or less than a width of a depletion layer formed at a maximum voltage thereof.

* * * * *